(12) United States Patent
Chen et al.

(10) Patent No.: US 8,427,857 B2
(45) Date of Patent: Apr. 23, 2013

(54) ELECTRICAL FUSE PROGRAMMING TIME CONTROL SCHEME

(75) Inventors: Po-Hung Chen, Taipei (TW); Sung-Chieh Lin, Zhubei (TW); Kuoyuan Hsu, San Jose, CA (US); Jiann-Tseng Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 418 days.

(21) Appl. No.: 12/774,851

(22) Filed: May 6, 2010

(65) Prior Publication Data

US 2011/0273949 A1    Nov. 10, 2011

(51) Int. Cl.
*G11C 17/00*    (2006.01)

(52) U.S. Cl.
USPC .............. 365/96; 365/94; 365/104; 365/105; 365/103; 257/209; 257/529

(58) Field of Classification Search ............ 365/94–105; 257/209, 529
See application file for complete search history.

(56) References Cited

U.S. PATENT DOCUMENTS

| | | | |
|---|---|---|---|
| 6,434,048 B1 * | 8/2002 | Tran et al. ................ | 365/185.19 |
| 2008/0186789 A1 * | 8/2008 | Sumi et al. ................ | 365/225.7 |
| 2011/0116299 A1 * | 5/2011 | Obayashi ................ | 365/96 |

* cited by examiner

*Primary Examiner* — Vu Le
*Assistant Examiner* — Han Yang
(74) *Attorney, Agent, or Firm* — Duane Morris LLP

(57) ABSTRACT

A circuit includes a fuse and a sensing and control circuit. The fuse is coupled between a MOS transistor and a current source node. The sensing and control circuit is configured to receive a programming pulse and output a modified programming signal to the gate of the MOS transistor for programming the fuse. The modified programming signal has a pulse width based on a magnitude of a current through the first fuse.

18 Claims, 9 Drawing Sheets

US 8,427,857 B2

ELECTRICAL FUSE PROGRAMMING TIME CONTROL SCHEME

FIELD OF DISCLOSURE

The disclosed system and method relate to semiconductor devices. More specifically, the disclosed system and method relate to programming fuses for integrated circuits formed on semiconductor wafers.

BACKGROUND

Electrical fuses are frequently included in integrated circuits. The fuses are blown in specific patterns to program certain integrated circuits. FIG. 1A illustrates one example of a conventional programmable fuse arrangement. As shown in FIG. 1A, the fuse 102 is disposed between a p-type transistor (PMOS) 104 and an n-type transistors (NMOS) 106. The first transistor 104 has its gate coupled to a bit line select line, its source coupled to a power supply, and its drain coupled to the fuse 102. The second transistor 106 has its source coupled to fuse 102, its gate coupled to a word line (WL), and its drain coupled to ground.

The fuse 102 is programmed by a logic zero being applied to the gate of PMOS transistor 104, which turns PMOS transistor 104 into a current-conducting 'on' state, and applying a programming pulse of a logic one to the gate of NMOS transistor 106, which transitions NMOS transistor 106 into a current-conducting 'on' state. The waveform for the programming signal, PGM, is illustrated in FIG. 1B. The logic zero at the gate of PMOS transistor 104 and the programming pulse at the gate of NMOS transistor 106 turns on transistors 104 and 106 such that current flows through fuse 102. The waveform for the fuse programming current is also shown in FIG. 1B. As shown in FIG. 1B, the programming current has a magnitude that is greater than the threshold of the fuse 102, which results in fuse 102 being blown or programmed. However, the conventional fuse arrangement illustrated in FIG. 1A frequently results in a varied resistance of the blown fuses especially across wide variations in processes, voltages, and temperatures (PVT). The large variations in resistance results in a narrower sensing margin making it more difficult to determine if a fuse has in fact been blown or programmed.

Accordingly, an improved fuse arrangement is desirable.

SUMMARY

A circuit including a fuse and a sensing and control circuit is disclosed. The fuse is coupled between a MOS transistor and a current source node. The sensing and control circuit is configured to receive a programming pulse and output a modified programming signal to the gate of the MOS transistor for programming the fuse. The modified programming signal has a pulse width based on a magnitude of a current through the fuse.

A method is also disclosed in which an intermediate programming pulse is generated in response to receiving a programming pulse at a pulse generator. A modified programming pulse is output to a gate of a transistor in response to receiving one of the intermediate programming pulse or a signal identifying that a current through a fuse falls below a threshold level. The modified programming pulse controls the current through the fuse.

Another circuit is disclosed including a fuse coupled to a MOS transistor and to a voltage supply node. A programming circuit is configured to provide a first programming signal to a gate of the MOS transistor to program the fuse in response to receiving one of a second programming signal or a signal identifying that a current through the fuse has fallen below a threshold level.

DETAILED DESCRIPTION

Figure 1A:
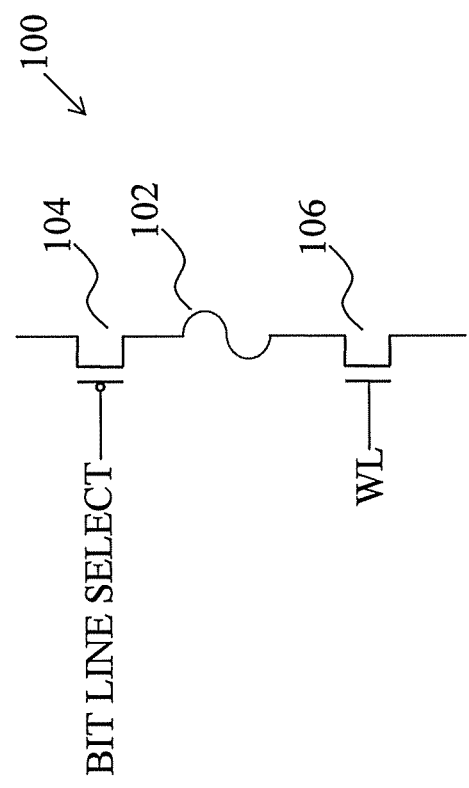
FIG. 1A is a block diagram of one example of a conventional programming fuse layout.
Figure 1B:
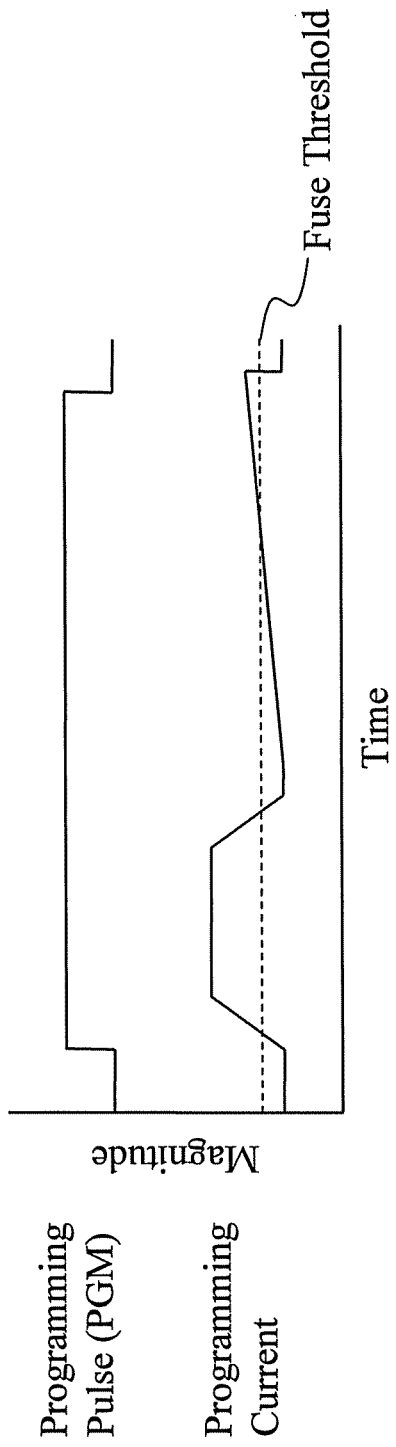
FIG. 1B is a timing diagram of the programming signal and the programming current of the conventional programming fuse layout illustrated in FIG. 1A.
Figure 2:
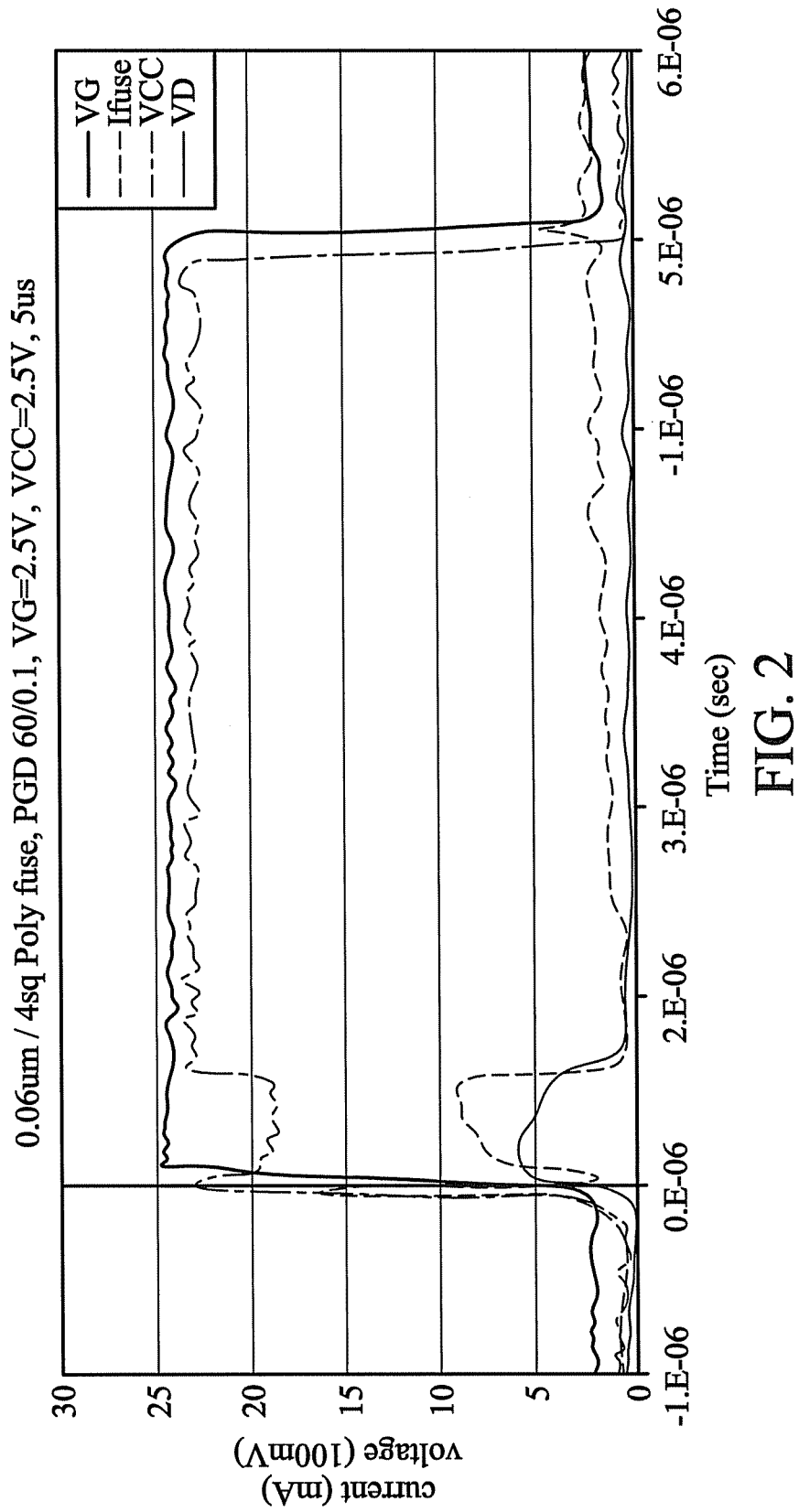
FIG. 2 is a plot of various parameters of a programming fuse layout versus time.

FIG. 2 is a plot showing the current and voltages at different locations in a fuse programming arrangement receiving a programming signal with a pulse width of approximately 5 µs. As shown in FIG. 2, the programming pulse, line VG, is received at the gate of an NMOS transistor, such as NMOS transistor 106 shown in FIG. 1A, at approximately t=0 µs. The programming pulse turns on the NMOS transistor and results in a programming current, Ifuse, beginning to flow through the fuse. As the current increases through the fuse, the drain voltage of the NMOS transistor, VD, and test voltage, VDDQ, briefly decrease.

At approximately the 1 µs mark, the value of Ifuse approaches zero amps, which signals the blowing or rupturing of the fuse. Ifuse then gradually increases for the remainder of the pulse width of the programming signal after the 1 µs mark as current begins to reflow through the fuse after the 1 µs mark. Current begins to flow through the fuse due to electromagnetic (EM) and thermal stresses forcing the polysilicon of the fuse to reform a conductive path. Accordingly, terminating the programming pulse at approximately the 1 µs mark in FIG. 2 would advantageously provide the greatest resistance across the blown fuse. However, conventional programming circuits, such as the arrangement described above with respect to FIG. 1A, need to ensure that all fuses are programmed and cannot account for all PVT variations and fuse types. Consequently, a longer programming pulse is typically used to ensure that all fuses are correctly programmed.

Figure 3A:
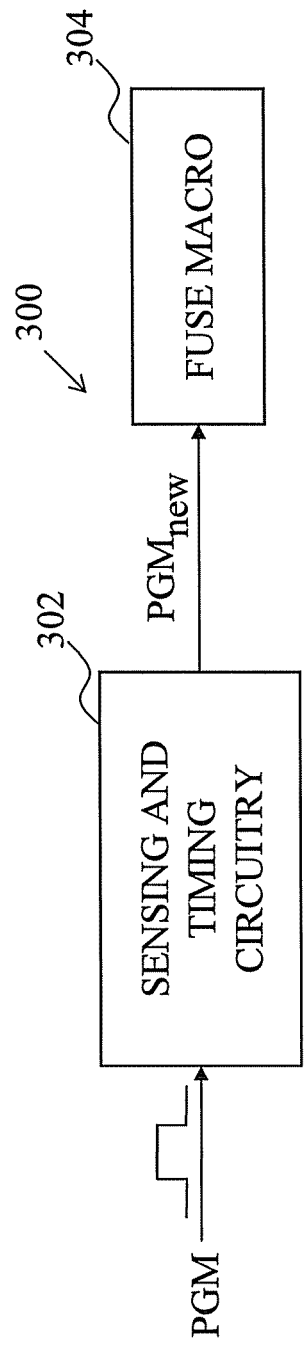
FIG. 3A is a block diagram of one example of an improved fuse programming layout.

FIG. 3A is a block diagram of one example of an improved fuse programming arrangement 300 for providing an optimal programming signal to a fuse. As shown in FIG. 3A, the arrangement 300 includes a sensing and timing (ST) block 302 coupled to a fuse macro 304. ST block 302 receives a programming pulse, PGM, and applies a modified programming pulse, $PGM_{new}$, to the fuse macro 304. The modified programming pulse, PGM$_{new}$, is applied to the fuse array until the ST block 302 senses that the current in the fuse array falls below a threshold value.

Figure 3B:
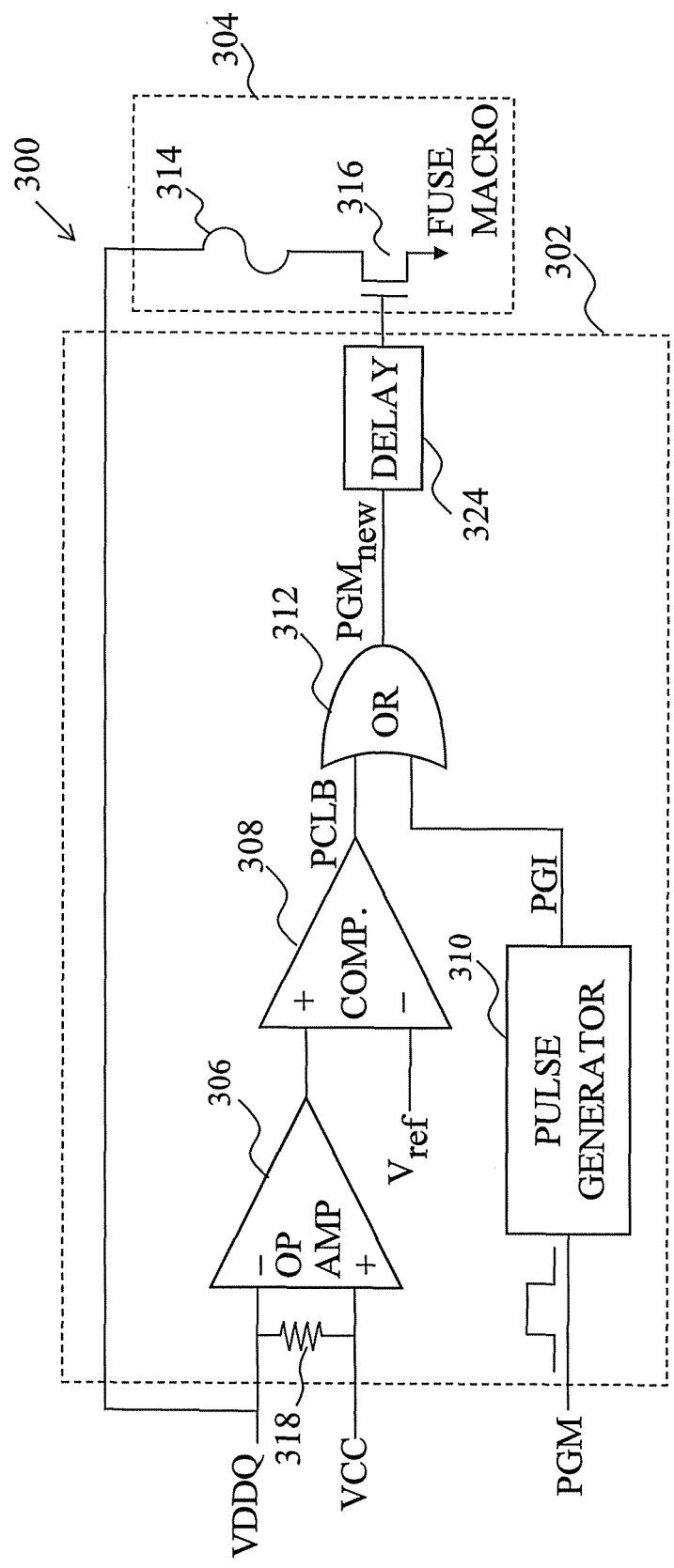
FIG. 3B is a detailed block diagram of the improved fuse programming layout illustrated in FIG. 3A.

FIG. 3B is a more detailed block diagram of the improved fuse programming arrangement 300 illustrated in FIG. 3A. As shown in FIG. 3B, the ST block 302 includes an operation amplifier ("op amp") 306, a comparator 308, a pulse generator 310, an OR logic gate 312, and a delay block 324. Fuse macro 304 includes at least one fuse 314 coupled to an NMOS transistor 316.

A voltage source node providing a voltage VCC is coupled to the positive input of op amp 306 and the negative input of op amp 306 receives a voltage VDDQ. A resistor 318 is coupled between the positive and negative inputs of op amp 306. The output of op amp 306 is coupled to a positive input terminal of comparator 308, which receives a reference voltage, V$_{ref}$, at its negative input. Comparator 308 outputs a signal, PCLB, indicative of the difference between the output of the op amp 306 and the reference voltage, V$_{ref}$, to the OR gate 312. OR gate 312 receives a signal, PGI, from pulse generator 310, which generates PGI in response to receiving a programming signal, PGM, at its input.

Figure 4A:
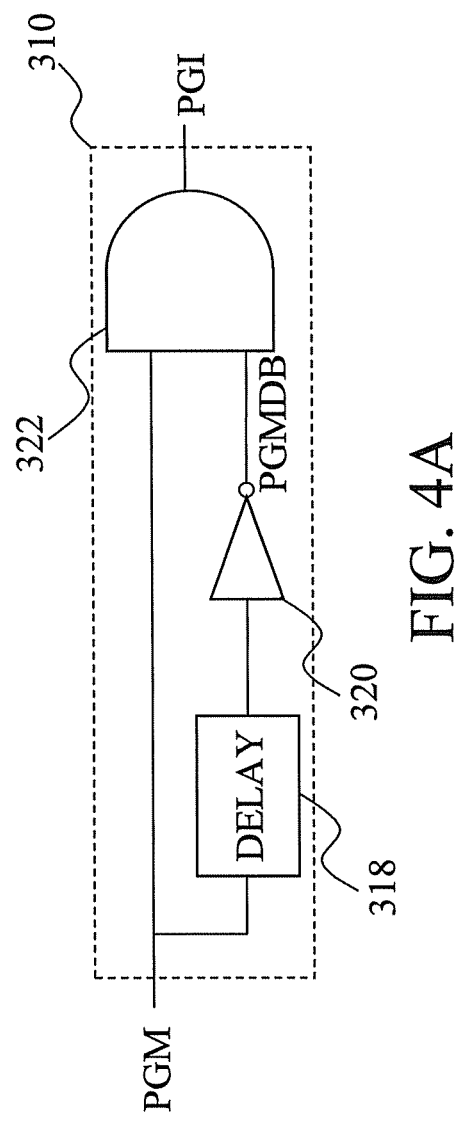
FIG. 4A is a block diagram of one example of a pulse generator in accordance with the improved fuse programming layout illustrated in FIG. 3B.

FIG. 4A illustrates one example of pulse generator 310, which may include a delay circuit 324, an inverter 320 coupled to an output of delay circuit 324, and a logic AND gate 322 coupled to an output of inverter 320. Delay circuit 324 is configured to receive programming signal PGM at an input and output a delayed signal to inverter 320. Inverter 320 outputs a signal, PGMDB, to AND gate 322, which receives the programming signal PGM at its other input.

Signal PGI output from AND gate 322 is received at an input of OR gate 312, which outputs a signal to a delay circuit 324 based on signals PGI and PCLB. Delay circuit 324 outputs new programming signal, PGM$_{new}$, to the gate of NMOS transistor 316 to control the turning on and off of NMOS transistor 316 thereby controlling the flow of a programming current through NMOS transistor 316 and through fuse 314.

Figure 4B:
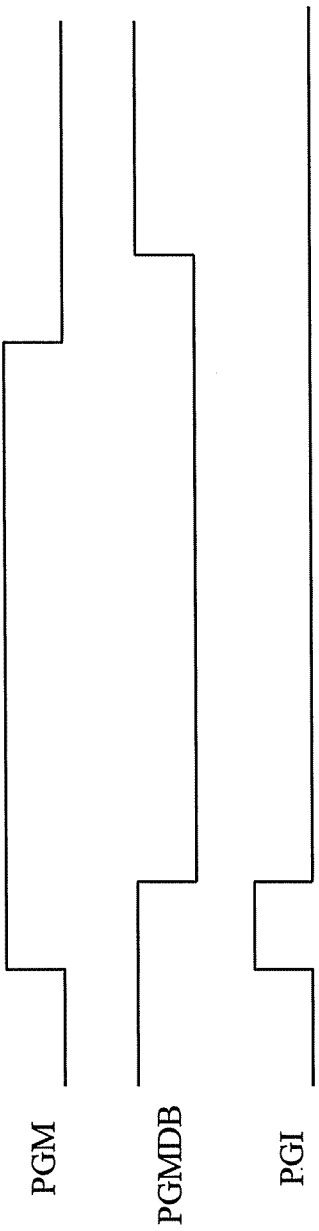
FIG. 4B is a timing diagram illustrating various signal traces of the pulse generator illustrated in FIG. 4A.
Figure 5:
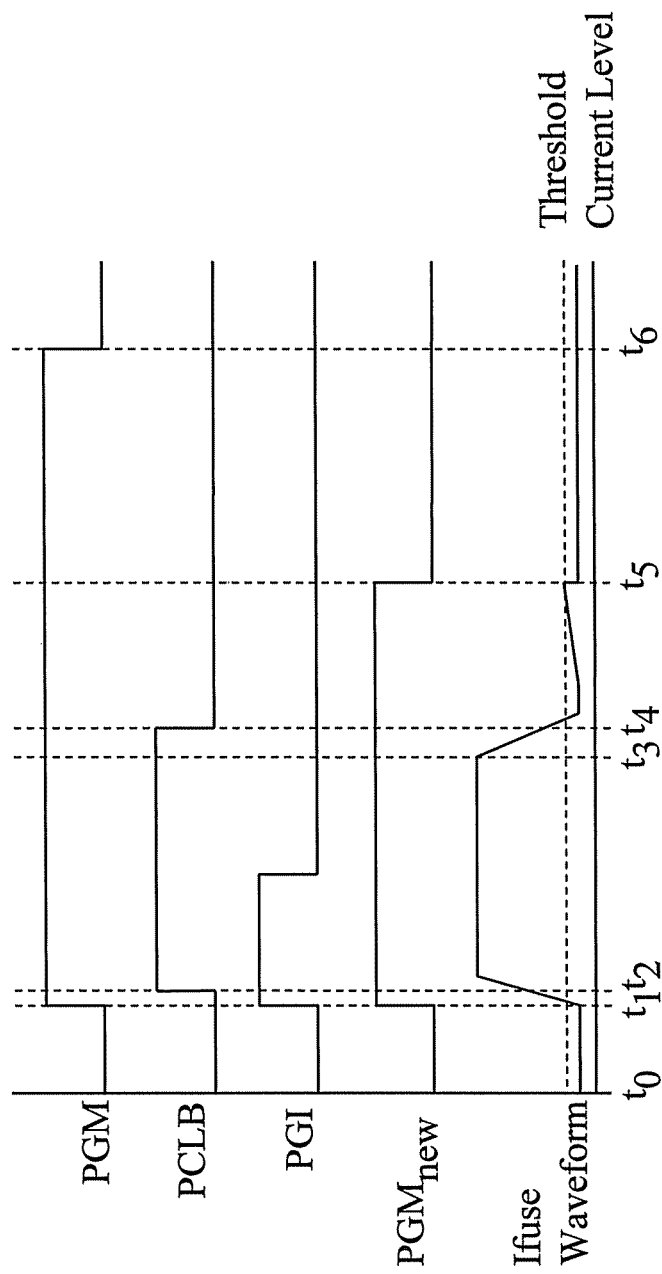
FIG. 5 is a timing diagram of the improved programming fuse layout in accordance with FIGS. 3A and 3B.

The operation of the fuse programming circuit 300 illustrated in FIG. 3B is described with reference to FIGS. 4B and 5, which are timing diagrams illustrating a plurality of waveforms of the fuse programming circuit 300. Initially, programming signal is a logic 'low' or 'zero', which results in signal PGMDB being logic 'high' or 'one' as shown in FIGS. 4B and 5/ With signal PGMDB low, the output of AND gate 322, signal PGI, is also low. When programming signal PGM transitions from low to high at time t=1 in FIG. 5, signal PGMDB is still high due to delay circuit 318 resulting in signal PGI output by AND gate 322 transitioning from low to high.

The pulse width of PGI is shorter than the pulse width of programming signal PGM due to signal PGMDB transitioning from high to low after the delay period set by delay circuit 318. The transition of signal PGMDB from high to low results in the signal PGI output by AND gate 322 transitioning from high to low even though programming signal PGM is still high.

PGI is received at OR logic gate 312, which outputs the new programming signal, PGM$_{new}$, to NMOS 316. NMOS 316 transitions from an 'OFF' state in which current does not pass through the channel between the source and drain to an 'ON' state in which current flows through the channel between the source and drain in response to receiving PGM$_{new}$ at its gate. The transition of NMOS 316 turning on can be seen in FIG. 5 as the magnitude of Ifuse transitions from a low value to a high value at time t=1.

Op amp 306 senses the current through fuse 314, and outputs a voltage representation of the current to the positive terminal of comparator 308. Comparator 308 compares the voltage representation of the sensed current through fuse 314 to a voltage representation, V$_{ref}$, of a configurable threshold current value and outputs signal PCLB when the sensed current exceeds the threshold current at time t=2.

The value of V$_{ref}$ may be set based on the threshold current, Ith, of fuse 314, the resistance value of resistor 318, and the gain of op amp 306. For example, the voltage across resistor 318, V$_{R318}$, is equal to Ifuse multiplied by the resistance of resistor 318. The voltage output of op amp 306, V$_{306}$, is equal to the gain of op amp 306 multiplied by the voltage across resistor 318, V$_{R318}$. Accordingly, if the threshold current Ith of fuse 314 is 3 mA and circuit 300 is implemented with resistor 318 having a resistance of 40 $\Omega$ and op amp 306 having a gain of 5, then V$_{ref}$ is set at 600 mV (e.g., V$_{ref}$=5*3 mA*40 $\Omega$=600 mV) such that a current above Ith will provide a voltage above V$_{ref}$ at the positive terminal of comparator 308, which will then provide an output signal, PCLB, equal to a logic one. If Ifuse is less than the threshold current, Ith, then the voltage received at the positive terminal of comparator 308 will be less than V$_{ref}$ and comparator 308 will output PCLB having a value equal to a logic zero.

At time t=3, fuse 314 ruptures as indicated by the steep negative slope for the Ifuse trace in FIG. 4. The current through fuse 314 decreases until it falls below the threshold value, Ith, at time t=4. When the current through fuse 314 falls below Ith, which has a voltage equivalent of V$_{ref}$ as described above, signal PCLB output by comparator 308 transitions from high to low. With PCLB and PCI being logic zeroes, OR logic gate 312 transitions from outputting a logic one to a logic zero after a gate delay at t=5 provided by delay circuit 324. The gate delay provided by delay circuit 324 may be adjusted to provide sufficient amount of time, e.g., 5 ns, for the fuse to be fully blown and the sensed current to transition to approximately zero amps.

With the output of OR logic gate 312, PGM$_{new}$, being a logic zero, NMOS transistor 316 turns off and stops the current from flowing through fuse 314. At time t=6, programming signal PGM transitions from a logic one to a logic zero.

Figure 6:
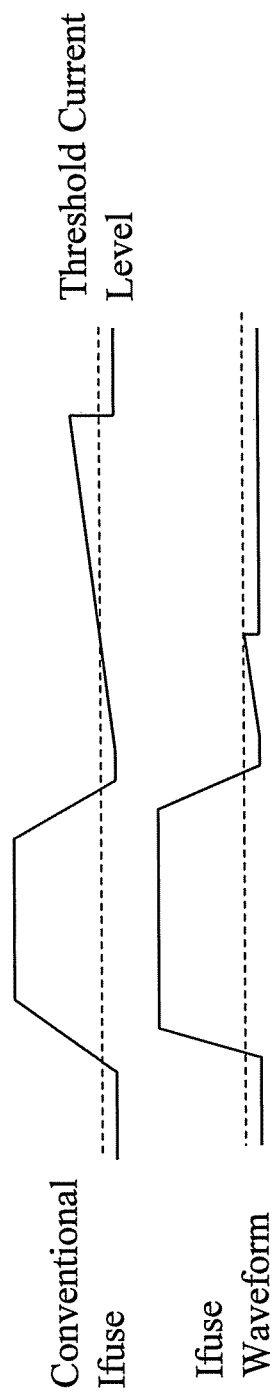
FIG. 6 is a timing diagram comparing the conventional fuse programming signal to the improved programming signal provided by the fuse programming layout illustrated in FIG. 3A.

FIG. 6 is a timing diagram comparing the conventional Ifuse waveform to the improved Ifuse waveform. As shown in FIG. 6, the improved Ifuse waveform is shorter than the conventional Ifuse waveform as the improved Ifuse waveform is based on a sensed current through the fuse. Providing a programming signal that is based on a sensed current through the fuse being programmed advantageously reduces the thermal stress applied to a fuse, which results in a higher resistance across a wide range of PVT variations for the blown fuse and a greater sensing margin.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A circuit, comprising:
a fuse coupled between a MOS transistor and a current source node; and
a sensing and control circuit coupled to a gate of the MOS transistor, the sensing and control circuit configured to receive a programming pulse and to output a modified programming signal to the gate of the MOS transistor for programming the first fuse, the modified programming signal having a pulse width based on a magnitude of a current through the first fuse as sensed by an operational amplifier that is configured to generate a voltage representation of the current flowing through the first fuse in response to sensing the magnitude of the current through the first fuse.

2. The circuit of claim 1, wherein the sensing and control circuit includes a pulse generator configured to provide an intermediate programming signal in response to receiving the programming pulse, the intermediate programming signal having a narrower pulse width than a pulse width of the programming pulse.

3. The circuit of claim 2, wherein the pulse generator provides the intermediate programming signal to a logic gate configured to generate the modified programming signal in response to receiving the intermediate programming signal.

4. The circuit of claim 3, wherein the sensing and control circuit includes a comparator circuit, the comparator circuit configured to
compare the voltage representation of the current flowing through the first fuse to a reference voltage, and
output a signal identifying that the voltage representation of the current flowing through the first fuse is less than the reference voltage.

5. The circuit of claim 1, wherein the operational amplifier includes a first input coupled to a first voltage source node and a second input coupled to the first fuse.

6. A method, comprising:
generating an intermediate programming pulse in response to receiving a programming pulse at a pulse generator;
sensing the current through the fuse with an operational amplifier;
generating a signal identifying if the current through the fuse falls below a threshold level based on a comparison of a voltage representation of the current through the fuse as generated by the operational amplifier to a reference voltage; and
outputting a modified programming pulse to a gate of a transistor in response to receiving one of the intermediate programming pulse or the signal identifying that the current through the fuse has fallen below the threshold level,
wherein the modified programming pulse controls the current through the fuse.

7. The method of claim 6, wherein the operational amplifier includes a first input coupled to a voltage source node and a second input configured to receive a voltage across a current source.

8. The method of claim 6, wherein the comparison of the voltage representation of the current through the fuse to the reference voltage is performed at a comparator.

9. The method of claim 6, wherein the signal identifying if the current through the fuse falls below the threshold level and the intermediate programming signal are received at a logic gate.

10. The method of claim 6, wherein reference voltage is a voltage representation of a current threshold of the fuse.

11. The method of claim 6, wherein the intermediate programming pulse has a narrower pulse width than a pulse width of the programming pulse.

12. An integrated circuit, comprising:
a fuse coupled to a first MOS transistor and to a voltage supply node; and
a programming circuit for providing a first programming signal to a gate of the MOS transistor for programming the fuse in response to receiving one of a second programming signal or a signal identifying that a current through the fuse has fallen below a threshold level wherein an OR gate receives the signal identifying that the current through the fuse falls below the threshold from a comparator.

13. The integrated circuit of claim 12, wherein the programming circuit includes the OR gate configured to output the first programming signal to the gate of the MOS transistor in response to receiving one of the second programming signal at a first input or the signal identifying the current through the resistor falls below the threshold at a second input.

14. The integrated circuit of claim 12, wherein the second programming signal is generated by a pulse generator in response to receiving a third programming signal.

15. The integrated circuit of claim 12, wherein the comparator has a first input for receiving the reference voltage and a second input coupled to an output of an operational amplifier.

16. The integrated circuit of claim 15, wherein the operational amplifier has a first input coupled to the first voltage supply node and a second input for receiving the voltage across the current source.

17. The integrated circuit of claim 16, wherein the operational amplifier is configured to sense the current through the fuse and output a voltage representation of the sensed current to the comparator.

18. The integrated circuit of claim 14, wherein the first and second programming signals have narrower pulse widths than a pulse width of the third programming signal.

* * * * *

UNITED STATES PATENT AND TRADEMARK OFFICE
CERTIFICATE OF CORRECTION

PATENT NO. : 8,427,857 B2
APPLICATION NO. : 12/774851
DATED : April 23, 2013
INVENTOR(S) : Po-Hung Chen et al.

Page 1 of 1

It is certified that error appears in the above-identified patent and that said Letters Patent is hereby corrected as shown below:

In the Claims:

Claim 6, Column 5, Line 29, delete ":" after amplifier and insert -- ; --.

Signed and Sealed this
Twelfth Day of November, 2013

Teresa Stanek Rea
*Deputy Director of the United States Patent and Trademark Office*